United States Patent [19]

Dean et al.

[11] 4,185,202
[45] Jan. 22, 1980

[54] X-RAY LITHOGRAPHY

[75] Inventors: Robert E. Dean, High Bridge; Dan Maydan, Short Hills; Joseph M. Moran, Berkeley Heights; Gary N. Taylor, Fanwood, all of N.J.

[73] Assignee: Bell Telephone Laboratories, Incorporated, Murray Hill, N.J.

[21] Appl. No.: 857,380

[22] Filed: Dec. 5, 1977

[51] Int. Cl.$^2$ .................. A61K 27/02; A61N 5/00; C08J 1/02; G21G 5/00
[52] U.S. Cl. ......................... 250/492 A; 250/492 R
[58] Field of Search ........... 250/492 A, 492 B, 492 R, 250/441, 457

[56] References Cited

U.S. PATENT DOCUMENTS

| | | | |
|---|---|---|---|
| 3,743,842 | 7/1973 | Smith et al. | 250/492 A |
| 4,066,905 | 1/1978 | Dassler et al. | 250/441 |
| 4,119,855 | 10/1978 | Bernacki | 250/492 R |

Primary Examiner—Craig E. Church
Assistant Examiner—Thomas P. O'Hare
Attorney, Agent, or Firm—Lucian C. Canepa

[57] ABSTRACT

X-ray lithographic systems as heretofore constructed include a low-attenuation chamber for propagating x-rays from a source toward a mask member that is positioned in close proximity to a resist-coated wafer. Both the mask and the wafer are included in the chamber which typically is either filled with helium or evacuated to a pressure less than about $10^{-2}$ Torr. In accordance with this invention, an x-ray lithographic system is constructed to enable establishment in the wafer-to-mask region of a controlled atmosphere that is separate and distinct from that maintained in the low-attenuation chamber. In this way, an improved lithographic system with advantageous throughput and other characteristics is realized.

20 Claims, 4 Drawing Figures

X-RAY LITHOGRAPHY

BACKGROUND OF THE INVENTION

This invention relates to the fabrication of microminiature devices and, more particularly, to an x-ray lithographic system utilized to make structures such as large-scale-integrated semiconductor devices.

An advantageous x-ray lithographic system for replicating submicron features on large areas in a highspeed way is described in *IEEE Transactions on Electron Devices*, Vol. ED-22, No. 7, July 1975, pages 429–433. To prevent the attenuation of x-rays in the exposure chamber of the described system, the chamber is typically either filled with helium or else maintained at a pressure less than about $10^{-2}$ Torr.

In practice, it has been observed that the presence of certain constituents such as oxygen in the mask-to-resist-coated-wafer region of an x-ray lithographic system significantly inhibits the exposure of the resist material to incident x-rays. Such inhibitors can be removed from the specified region by, for example, evacuating the exposure chamber, as mentioned above. But the evacuation process is time-consuming and thereby imposes an undesirable limit on the throughput capabilities of the system.

Moreover, although a helium atmosphere established in the exposure chamber can also be effective in removing inhibitors from the mask-to-wafer region, the cleansing action achieved thereby in practice occurs relatively slowly. Hence a system with a helium-filled exposure chamber also exhibits limited throughput capabilities.

In prior art x-ray lithographic systems as heretofore proposed, the aforementioned atmosphere in the mask-to-wafer region is invariably the same as that maintained in the source-to-mask zone. Accordingly, even aside from considerations of throughput, applicants recognized that such known systems are inherently inflexible and not easily adaptable to having their exposure characteristics optimized under a variety of operating conditions. After recognizing these deficiencies of known systems, applicants directed their efforts at trying to devise an improved x-ray exposure system having advantageous throughput characteristics and at the same time exhibiting the flexibility of being arrangeable to enhance other specified properties of the exposure process carried out in the system.

SUMMARY OF THE INVENTION

Accordingly, an object of the present invention is an improved x-ray lithographic system characterized by high throughput and other advantageous properties.

Briefly, this and other objects of the present invention are realized in a specific illustrative x-ray lithographic system constructed to enable establishment in the wafer-to-mask region thereof of a controlled atmosphere that is separate and distinct from that maintained in the low-attenuation chamber of the system. In that way specified characteristics of the lithographic process can be significantly enhanced without deleteriously affecting the low-attenuation properties of the system.

BRIEF DESCRIPTION OF THE DRAWING

A complete understanding of the invention and of the above and other objects, features and advantages thereof may be gained from a consideration of the following detailed description presented hereinbelow in connection with the accompanying drawing, in which.

DETAILED DESCRIPTION

Figure 1:
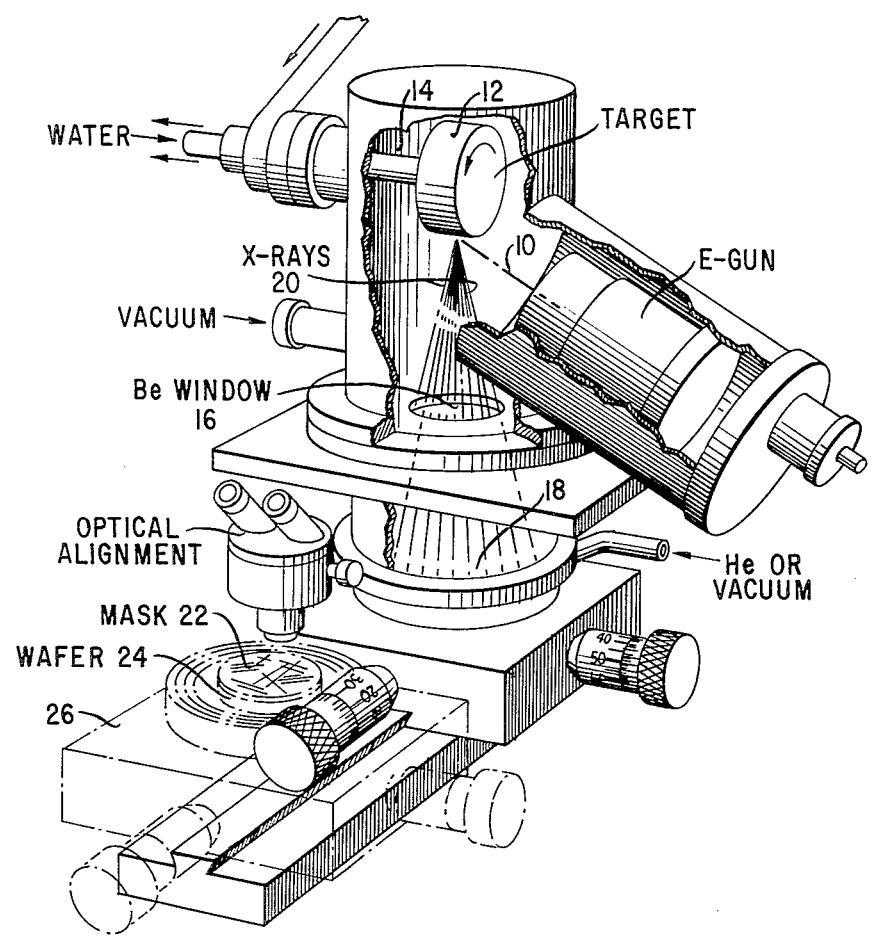
FIG. 1 depicts a known x-ray lithographic system.

A schematic representation of a specific illustrative x-ray exposure system made in accordance with the prior art is shown in FIG. 1. In the depicted system, a focused beam of electrons (indicated by dashed line 10) is directed at a rotating water-cooled target 12 which is contained in a high-vacuum chamber 14. (The chamber 14 is maintained, for example, at a pressure of about $10^{-6}$ Torr.) In response to incident electrons, the target 12 provides relatively short-wavelength x-rays. For example, for a target made of palladium and for a 25 kilovolt-4.5 kilowatt electron beam, x-rays at a wavelength of 4.36 Angstrom units are emitted by the target 12.

X-rays provided by the target 12 in the high-vacuum chamber 14 of FIG. 1 pass through a thin beryllium window 16 into an exposure chamber 18. (X-rays propagated into the chamber 18 are designated by dashed lines 20.) To minimize attenuation of x-rays in the exposure chamber 18, this chamber is typically either filled with helium or else established at a relatively low vacuum such as about $10^{-2}$ Torr.

Also shown in FIG. 1 are standard mask and wafer members 22 and 24, respectively. (These members are depicted in more detail in FIG. 2.) As is well known, the members 22 and 24 are typically established in a precise spaced-apart relationship and optically aligned with respect to each other while mounted on a movable stage 26 positioned away from the exposure chamber 18. Mask-to-wafer spacings in the range of 30 to 150 microns are typical. Herein, it will be assumed for purposes of a specific example that the mask-to-wafer spacing is 40 microns.

After the mask and wafer members 22 and 24 mounted on the stage 26 of FIG. 1 are oriented with respect to each other in a specified manner, the stage 26 is moved into registry with the bottom end of the exposure chamber 18 wherein, as previously described, an appropriate helium or low-vacuum atmosphere is established. Subsequently, the mask 22 is irradiated with x-rays, in a standard way well known in the art.

FIG. 1 is simply a generalized showing of the type of prior art system to which the improvements to be described below are applicable. Numerous standard variations of the depicted system are, of course, possible. For example, various other known x-ray sources, including a synchrotron, may be substituted for the specific illustrative source shown in the drawing.

Figure 2:
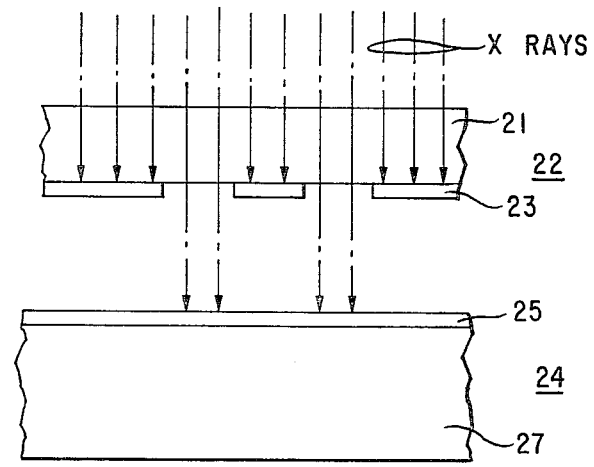
FIG. 2 shows spaced-apart mask and wafer elements of the type intended to be mounted in an x-ray lithographic system.

In FIG. 2 the mask member 22 is shown as comprising an x-ray-transparent substrate 21 made, for example, of Kapton polyimide film. (Kapton is a registered trademark of E. I. duPont de Numours and Co.) Deposited on the mask substrate 21 is a high-resolution pattern of x-ray-absorptive elements 23 made, for example, of gold or of a prescribed combination of metals. (An illustrative x-ray mask of the general type represented in FIG.

2 is described in detail in U.S. Pat. No. 4,037,111.) Spaced apart from the mask 22 is a wafer member 24 that comprises an x-ray-sensitive resist layer 25 adhered to a substrate 27. (Illustrative x-ray-sensitive resists of the negative type are described in a commonly assigned copending U.S. application of G. N. Taylor, Ser. No. 680,156 now U.S. Pat. No. 4,061,829, filed Apr. 26, 1976, now U.S. Pat. No. 4,061,829, issued Dec. 6, 1977 and in a commonly assigned copending U.S. application of E. D. Feit and L. F. Thompson, Ser. No. 726,590, filed Sept. 27, 1976. A variety of other x-ray-sensitive resists, including high-speed electron resists suitable for use in an x-ray lithographic system, are known.)

In practice, it has been observed that in certain negative resists the crosslinking caused by x-ray exposure is deleteriously affected by the presence in the mask-to-wafer zone of uncontrolled amounts of inhibiting constituents. (It is postulated that the exposure of certain positive resists can also be deleteriously affected by inhibiting constituents.) For processes that occur via free radical, ionic and excited state intermediates, uncontrolled amounts of constituents such as oxygen and water in the specified zone act to significantly inhibit the desired crosslinking process. As a result thereof, the time required in the system to achieve a specified exposure condition may become unacceptably long.

As a practical matter, the avoidance of the aforementioned inhibition problem in prior art x-ray exposure systems is typically accomplished in a manner that significantly reduces the throughput characteristics thereof. Once the mask and wafer members are brought into registry with the bottom end of the exposure chamber 18 (FIG. 1), a relatively long time is required to establish an appropriate vacuum or helium atmosphere therein that is substantially inhibitor-free in the critical mask-to-wafer zone of the system. Exposure of the resist-coated wafer typically is not initiated until such an atmosphere is established in the critical zone.

Figure 3:
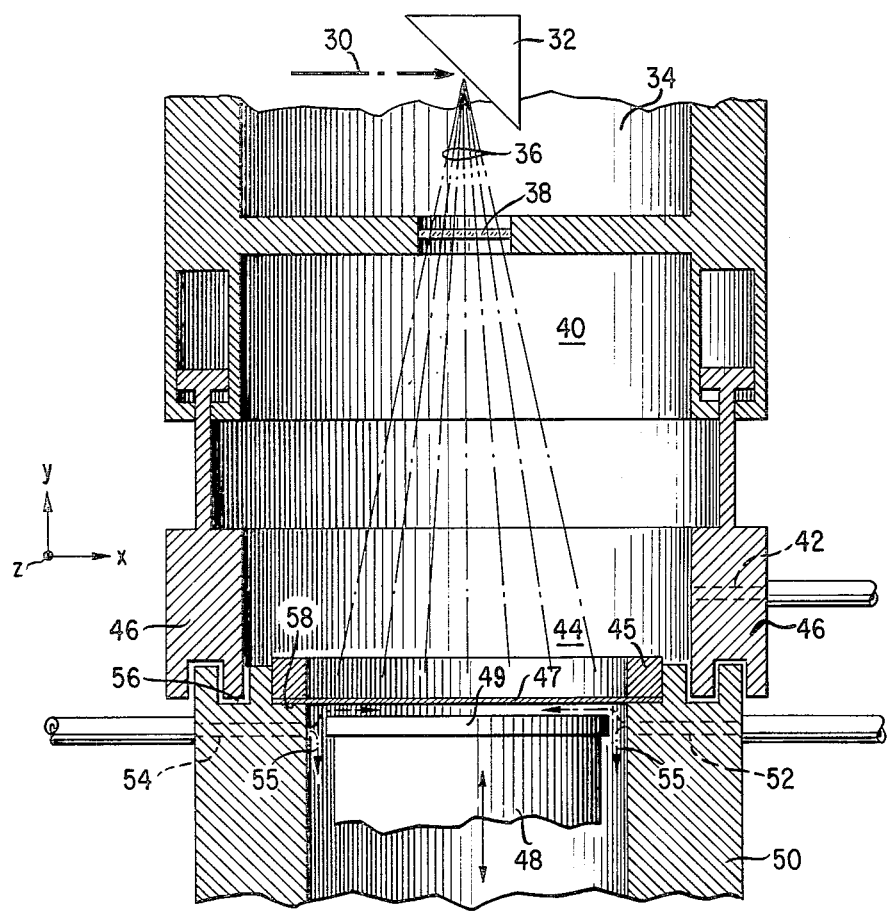
FIG. 3 is a side view of a specific illustrative x-ray lithographic system made in accordance with the principles of the present invention.

In accordance with the principles of the present invention, an improved x-ray lithographic system is provided. A specific illustrative such system is shown in FIG. 3. As in the aforedescribed system, a beam 30 of electrons directed at a target 32 positioned in a high-vacuum chamber 34 is effective to cause x-rays 36 to propagate through a window 38 into a chamber 40. Illustratively, the chamber 40 is filled via an inlet passageway 42 with a medium such as helium gas through which the x-rays 36 propagate toward the bottom of the depicted system with relatively little attenuation. To minimize geometrical distortions in the system, the distance between the source 32 and a mask member 44 located at the bottom of the low-attenuation chamber 40 is typically about 50 centimeters.

Illustratively, the system shown in FIG. 3 comprises a cylindrical chamber 40 having a sidewall portion 46 that is movable in the y direction. By moving the portion 46 in the positive y direction, clearance is provided for bringing a fixture containing associated mask and wafer members into registry with the bottom end of the chamber 40. The fixture may, for example, be mounted on a slidably movable table of the known type schematically represented in FIG. 1. By means of such a table, the mask and wafer members can be moved in the z direction (FIG. 3) after a prescribed orientation therebetween is established.

More specifically, the mask member 44 and an associated resist-coated wafer member 49 (FIG. 3) are initially placed on the movable table at a loading position removed from the bottom end of the chamber 40. The table contains, for example, a vacuum chuck 48 for holding the wafer member 49. In a standard way, the spacing and registration between the members 44 and 49 are adjusted to conform to prescribed criteria while the table is in its loading position. During the registration process a microscope having, for example, a unique bifocus element of the type described in U.S. Pat. No. 3,990,798 is advantageously employed. Subsequently, the table is moved from the aforementioned loading position to a position in registry with the bottom end of the chamber 40. The sidewall portion 46 thereof is then lowered to engage the mask-wafer fixture.

The particular mask-wafer fixture schematically represented in FIG. 3 comprises a cylindrical frame member 50 having at least two inlet passageways 52 and 54 therethrough. The chuck 48 holding the resist-coated wafer 49 is mounted within the frame member 50. In turn, both the member 50 and the chuck 48 are, for example, mechanically mounted on a slidably movable table of the type shown in FIG. 1.

By way of a specific illustrative example, the top of the frame member 50 of FIG. 3 is formed to include a groove 56 having a rectangular cross section and a shoulder portion 58. The groove 56 is intended to mate approximately with the bottom surfaces of the sidewall portion 46 when the portion 46 is lowered into its depicted position. And the shoulder portion 58 serves to support the mask member 44 which, for example, comprises a relatively thick dimensionally stable member 45 having a patterned thin-film element 47 supported thereby.

As indicated in FIG. 3, the mating surfaces of the sidewall portion 46 and the frame member 50, together with the mounted mask member 44, serve to define the bottom of the chamber 40 and to enable the establishment in the chamber 40 of a low-attenuation helium atmosphere at a pressure which is greater than atmospheric pressure. (This implies a continuous flow of helium effusing from the chamber 40.) In one specific system made in accordance with the principles of the present invention, a flow of approximately 10 liters of helium per minute through the inlet passageway 42 was effective to maintain the desired low-attenuation atmosphere of substantially pure helium in the chamber 40.

In accordance with one particular feature of this invention, a controlled atmosphere that is separate and distinct from that maintained in the chamber 40 of FIG. 3 is established in the critical mask-to-wafer zone of the depicted system. Illustratively, this is done by flowing an inhibitor-free medium via the inlet passageways 52 and 54 into the critical zone. Nitrogen, for example, has been determined to be well suited for this purpose. In one specific system made in accordance with this invention, a flow of approximately 2.9 liters of nitrogen per minute via the inlet passageways 52 and 54 at an inlet gauge pressure of about 5–50 pounds per square inch was effective to establish and maintain the desired inhibitor-free atmosphere in the mask-to-wafer zone of the system. Dashed lines 55 in FIG. 3 indicate the flow that occurs in the system to establish the desired atmosphere in this zone.

To expedite removal of inhibiting agents from the aforespecified mask-to-wafer zone, it is advantageous in some cases of practical interest to commence flushing this zone while the noted holding fixture is still in its loading position remote from the chamber 40. For this purpose a flow of, for example, 5 liters of nitrogen per minute at an inlet gauge pressure of about 5–50 pounds per square inch was determined to be effective. This flow is advantageously continued while the fixture is being moved from its loading position to its exposure position. Then, when the fixture is in its exposure position in registry with the sidewall portion 46, the nitrogen flow may, for example, be reduced to the aforespecified 2.9 liters per minute to maintain the zone inhibitor-free.

In accordance with the principles of the present invention, media other than nitrogen may be utilized to establish the aforeprescribed atmosphere in the mask-to-wafer zone of an x-ray lithographic system. Thus, for example, any inert gas (except radon) or a mixture thereof or a variety of unreactive gases may be utilized for this purpose in the specified zone. (The term "unreactive" is used herein in the sense of not reacting with any of the component elements of the herein-described mask and wafer members and of not deleteriously affecting the exposure and development of the particular x-ray-sensitive resist employed, in the system.) By way of example, for the particular illustrative mask and resist materials mentioned earlier above, unreactive gases such as methane and propane are suitable for establishing an inhibitor-free atmosphere in the critical mask-to-wafer zone in a relatively short period of time.

Of course, the medium utilized in the critical mask-to-wafer zone and the pressure thereof must be selected so as not to cause inordinately high x-ray attenuation for a given mask-to-wafer separation. In any case, in accordance with a basic aspect of the principles of the present invention, a flushing medium is directly applied to the critical zone by means of a flow system that is separate and distinct from the system utilized to establish the low-attenuation atmosphere in the chamber 40 of the described apparatus.

By directly controlling the atmosphere in the mask-to-wafer zone in the particular ways specified above, a substantially inhibitor-free region can be rapidly established therein. In this way, in accordance with one aspect of the principles of the present invention, a high-throughput lithographic system having an improved sensitivity to x-ray exposure is achieved.

In practice, very little if any of the medium introduced into the mask-to-wafer zone of the FIG. 3 system flows into the chamber 40. This is so because of the sealing action provided by the mask member 44 resting on the shoulder 58 of the frame member 50. (In addition, it may be advantageous to maintain the pressure in the chamber 40 greater than that in the mask-to-wafer zone of the system.) As a result, the low-attenuation characteristic of the helium or other atmosphere established in the chamber 40 is not deleteriously affected by the introduction therein of x-ray-attenuating constituents from the separate and distinct atmosphere established in the mask-to-wafer zone.

Applicants have also discovered that the purposeful introduction into the mask-to-wafer zone of an x-ray lithographic system of a controlled and relatively small amount of an inhibiting constituent such as oxygen can, surprisingly, significantly improve certain parameters of the exposure process. Applicants' aforedescribed system, unlike those of the prior art, has the unique capability to directly introduce such a constituent into the critical mask-to-wafer zone in a precisely controlled and localized way.

Thus, for example, applicants have found that by adding approximately one part by volume of oxygen or dry air to about 300-to-600 parts by volume of nitrogen, an advantageous atmosphere for introduction into the mask-to-wafer zone of the FIG. 3 system is provided. In the presence of such a controlled inhibitor-containing atmosphere, x-ray-sensitive resists of the type specified earlier above do indeed suffer some loss in sensitivity. But, significantly, what also has been observed to occur is that the resolution capabilities and the adhesion properties of the resist are thereby substantially improved. For example, by utilizing a controlled oxygen-nitrogen atmosphere of the particular type specified above, with the resists described in the aforecited copending applications, it was determined that the x-ray exposure time had to be increased by a factor of 1.5 to achieve a specified exposure in the resist material. But, significantly, at the same time it was observed that the resolution achievable in the pattern formed thereby in the resist was improved by a factor of four. In addition, the adhesion of the resist layer to its underlying substrate was also determined to have been thereby improved.

A tentative explanation proposed by applicants as to why the presence of a controlled amount of an inhibiting agent in the mask-to-wafer zone of the hereindescribed system leads to improved resolution and adhesion characteristics is as follows.

Normally, crosslinked polymeric negative resist materials undergo substantial volume changes (swelling) during the solvent development process which removes uncrosslinked material from both the unirradiated and irradiated portions of the resist. Polymer material is in fact removed from the latter because doses normally used in practice are not sufficient to fully crosslink the resist. Swelling is caused by interactions between the solvent and both the crosslinked and uncrosslinked polymer material and is restricted by crosslinks which hold the material together in the irradiated regions.

Swelling is a necessary first step prior to dissolution. For many thin (less than about 2 microns) negative resist systems the entire resist presumably first swells and then dissolves. This leads disadvantageously to distorted and webbed features when the swelled volume is sufficiently large such that two adjacent features penetrate one another. Adhesion can also be adversely affected by stresses encountered upon swelling. This effect can be minimized by controlling the extent of swelling which is a function of the morphology of the polymeric resist and the strength of the solvent-resist interaction.

One resist material which is not swelled during development is poly(methyl methacrylate). It dissolves layer by layer without appreciable swelling in a manner similar to that observed during etching. We believe that negative resists exposed in the presence of controlled amounts of inhibitors develop in a manner similar to that for poly(methyl methacrylate). Presumably in order for this to happen the dissolution rate of uncrosslinked material must approach the solvent permeation rate. We believe that this can happen when an exposure is conducted with gaseous inhibitors because the inhibitors change the normally uniform crosslink density to a nonuniform crosslink density which is greatest at the resist-substrate interface and least at the resist-gas mixture interface. This nonuniform crosslink density is possible because the amount of inhibition changes continuously throughout the film. This is caused by changes in the steady-state concentration of the inhibitor which is affected by system conditions such as radiation flux, inhibitor partial pressure, gas permeation, film attenuation and film thickness. The net result during dissolution presumably is that the nonuniform cross-linked exposed area dissolves in a etching-like manner, layer by layer, permitting smooth contraction during development to a final developed state which is not as extensively swollen as a uniformly crosslinked material. Adhesion is presumably better because of less stress present during the development process.

In accordance with the principles of the present invention, various specific structural arrangements other than the particular one shown in FIG. 3 are feasible for establishing a controlled atmosphere in the mask-to-wafer zone of an x-ray lithographic system. A specific illustrative alternative such arrangement that has operated advantageously in practice is schematically represented in FIG. 4.

Figure 4:
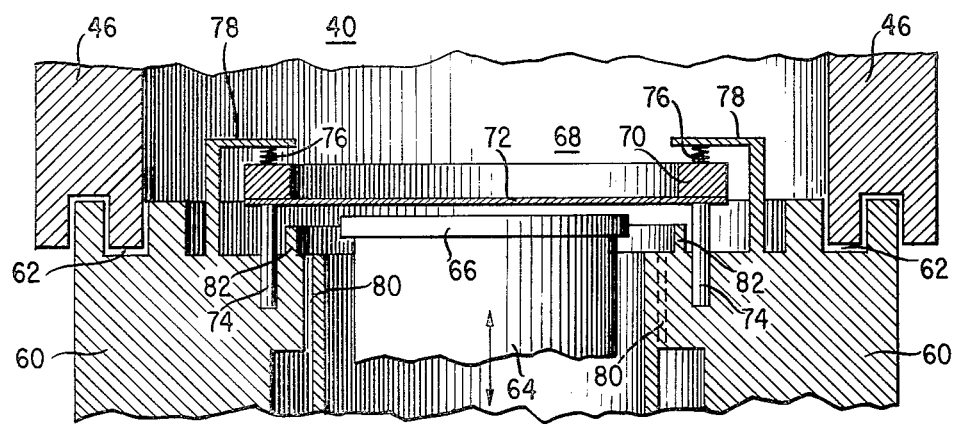
FIG. 4 depicts a portion of another specific system that embodies the principles of this invention.

The arrangement depicted in FIG. 4 includes a movable sidewall member 46 which is, for example, identical to the correspondingly numbered element shown in FIG. 3. As in FIG. 3, the member 46 defines the lower portion of a low-attenuation chamber 40. When located in the exposure position indicated in FIG. 4, the member 46 mates approximately with a portion of the top surface of a cylindrical frame member 60 that includes an annular groove 62 therein. Disposed within the frame member 60 is a vertically movable chuck 64 having a resist-coated wafer 66 mounted on the top surface thereof. Spaced apart from the wafer 66 is a mask member 68 that comprises, for example, a dimensionally stable thick portion 70 that supports a relatively thin patterned membrane 72.

Illustratively, the mask member 68 of FIG. 4 is supported by several spaced-apart pin members 74 that are mounted on the frame member 60. In addition, a spring-loaded pin element 76 supported by an element 78 mounted on the frame member 60 is disposed in approximate alignment with each of the members 74 to apply a retaining force to the mask portion 70.

Advantageously, multiple vertically extending inlet passageways 80 (FIG. 4) are formed in the cylindrical frame member 60 in close proximity to the central opening therein that accommodates the wafer-carrying chuck 64. In turn, the passageways 80 are connected to a supply chamber (not shown). By means of the passageways 80, a controlled atmosphere of the type specified earlier above is established in the mask-to-wafer zone of the depicted arrangement.

The top surface of the illustrative frame member 60 shown in FIG. 4 includes an annular baffle portion 82. This portion assists in confining the medium introduced through the passageways 80 to the aforespecified mask-to-wafer zone. Because of the baffle portion 82 and because, in addition, of the less restrictive downward flow path available for this medium between the frame member 60 and the wafer-supporting member 64, very little if any of the medium is introduced into the chamber 40. Accordingly, the low-attenuation condition desired to be maintained in the chamber 40 is thereby virtually unaffected. (In some embodiments, it may be advantageous to replace the baffle 82 and the three supporting pins 74 with a continuous sealing member.) At the same time, very little if any of the helium or other medium in the chamber 40 flows into the mask-to-wafer region because the gaps between the member 46 and 60 are designed to provide a principal outlet from the chamber 40 for the medium flowing therein. Hence, as a practical matter, and in accordance with the principles of this invention, separate and distinct atmospheres are maintained in the chamber 40 and in the mask-to-wafer zone of the FIG. 4 arrangement.

In one particular illustrative embodiment of the FIG. 4 arrangement, the vertical distance between the top of the baffle portion 82 and the overlying mask member 68 was approximately 0.001 inches; the distance between the wafer-supporting member 64 and the inner cylindrical surface of the frame member 60 was approximately 0.125 inches; and the diameter of each of 24 passageways 80 was approximately 0.020 to 0.040 inches.

Finally, it is to be understood that the various above-described arrangements are only illustrative of the application of the principles of the present invention. In accordance with these principles, numerous other modifications and variations may be devised by those skilled in the art without departing from the spirit and scope of the invention.

What is claimed is:

1. In combination in a high-resolution x-ray lithographic system designed to irradiate an x-ray mask member that is adapted to be positioned in said system in close proximity to a substrate coated with an x-ray-sensitive resist material, said system comprising an x-ray source, and a low-attenuation chamber for propagating x-rays from said source to irradiate said mask member, characterized in that said system includes
means for establishing in the space between said mask and said resist material a gas flow that constitutes a controlled atmosphere that is distinct and separate and of different gaseous composition from the atmosphere maintained in said chamber.

2. In combination in an x-ray lithographic system of the type in which substantially the entire top surface of a mask whose bottom surface is positioned in a spaced-apart relationship with respect to a resist-coated wafer is adapted to be irradiated with x-rays that are propagated toward the mask in a low-attenuation chamber, said combination comprising
means adapted to be positioned at the bottom end of said chamber for holding said mask and wafer in a prescribed spaced-apart orientation, and
means for establishing in the mask-to-wafer region of said system a gas flow that constitutes a controlled atmosphere that is separate and distinct and of different gaseous composition from the atmosphere established in said chamber.

3. A combination as in claim 2 wherein said holding means comprises a frame member having a top surface adapted to be mated with the bottom surface of a member that defines the lower portion of said chamber, said frame member including means for mounting said mask so that the mask itself serves to enclose a portion of the bottom of said chamber in such a way that the chamber enclosed thereby is substantially isolated from the mask-to-wafer region.

4. A combination as in claim 3 wherein said establishing means includes passageways formed in said frame member through which a medium constituting said controlled atmosphere can be flowed into said mask-to-wafer region.

5. A combination as in claim 4 wherein said holding means is mounted on a table that is movable between the bottom end of said chamber and a loading position that is remote from said bottom end, and wherein said establishing means is capable of being actuated to initiate the establishment of said controlled atmosphere in the mask-to-wafer region while said table is in its loading position.

6. A method for fabricating high-resolution microminiature devices by irradiating via a low-attenuation chamber one surface of a patterned mask member with x-rays that propagate through transparent portions of said member to impinge upon corresponding portions of a resist-coated member that is positioned in a spaced-apart relationship with respect to said mask member, said method comprising the step of establishing in the region between said members a gas flow that constitutes a controlled atmosphere that is separate and distinct and of different gaseous composition from the atmosphere established in said chamber.

7. A method as in claim 6 wherein said controlled atmosphere contains substantially no constituents that act to inhibit the reaction of the resist coating to x-ray irradiation.

8. A method as in claim 6 wherein said controlled atmosphere purposely contains a relatively small prescribed amount of a constituent that acts to inhibit the reaction of the resist coating to x-ray irradiation.

9. A method as in claim 6 wherein said controlled atmosphere is established between said members before said members are brought into registry with said chamber for x-ray exposure.

10. A method as in claim 9 wherein the flow rate of the controlled atmosphere established between said members before said members are brought into registry with said chamber is greater than the flow rate therebetween when said members are in registry with said chamber in position for x-ray exposure.

11. A method as in claim 6 wherein the pressure of said controlled atmosphere is less than that of the atmosphere in said chamber.

12. A method as in claim 11 wherein the pressure of said controlled atmosphere is slightly in excess of atmospheric pressure.

13. A method as in claim 6 wherein said low-attenuation chamber contains a helium atmosphere and said gas flow comprises a flow of nitrogen.

14. A method as in claim 6 wherein said low-attenuation chamber contains a helium atmosphere and said gas flow comprises a flow of approximately one part by volume of oxygen or dry air to about 300-to-600 parts by volume of nitrogen.

15. In combination in a high-resolution x-ray lithographic system designed to irradiate an x-ray mask member that is adapted to be positioned in said system in close proximity to a substrate coated with an x-ray-sensitive resist material, said system comprising an x-ray source in a chamber adapted to have a vacuum established therein, and a separate low-attenuation chamber contiguous said first-mentioned chamber for propagating x-rays from said source to irradiate said mask member, characterized in that said system includes means for establishing in the space between said mask and said resist material a controlled atmosphere that is separate and distinct and of different gaseous composition from the atmospheres respectively maintained in said first- and second-mentioned chambers.

16. A combination as in claim 15 wherein said establishing means comprises means for establishing a gas flow in said space.

17. A combination as in claim 16 further including means for establishing a helium atmosphere in said low-attenuation chamber.

18. A combination as in claim 17 wherein said helium atmosphere is established at a pressure slightly in excess of atmospheric pressure.

19. A combination as in claim 16 wherein said gas flow comprises a flow of nitrogen.

20. A combination as in claim 16 wherein said gas flow comprises a flow of approximately one part by volume of oxygen or dry air to about 300-to-600 parts by volume of nitrogen.

* * * * *